(12) United States Patent
Jiang et al.

(10) Patent No.: US 10,506,085 B2
(45) Date of Patent: *Dec. 10, 2019

(54) ELECTRONIC PRODUCT METAL SHELL HAVING ANTENNA GROOVE

(71) Applicant: BYD COMPANY LIMITED, Shenzhen, Guangdong (CN)

(72) Inventors: Baorong Jiang, Shenzhen (CN); Chongchong Liao, Shenzhen (CN); Aihua Li, Shenzhen (CN); Liang Chen, Shenzhen (CN)

(73) Assignee: BYD COMPANY LIMITED, Shenzhen (CN)

( * ) Notice: Subject to any disclaimer, the term of this patent is extended or adjusted under 35 U.S.C. 154(b) by 113 days.

This patent is subject to a terminal disclaimer.

(21) Appl. No.: 15/632,013

(22) Filed: Jun. 23, 2017

(65) Prior Publication Data

US 2017/0295267 A1    Oct. 12, 2017

Related U.S. Application Data

(63) Continuation of application No. PCT/CN2015/098304, filed on Dec. 22, 2015.

(30) Foreign Application Priority Data

Dec. 26, 2014    (CN) .......................... 2014 1 0834560

(51) Int. Cl.
*H05K 5/04*    (2006.01)
*H04M 1/02*    (2006.01)
(Continued)

(52) U.S. Cl.
CPC ............ *H04M 1/026* (2013.01); *H01Q 1/243* (2013.01); *H01Q 1/38* (2013.01); *H01Q 13/02* (2013.01);
(Continued)

(58) Field of Classification Search
CPC .. H04N 5/378; H04N 5/379; H01L 27/14634; H01L 27/14636; H03M 1/12; H03M 1/123; H03M 1/56
See application file for complete search history.

(56) References Cited

U.S. PATENT DOCUMENTS 8,941,543 B2    1/2015  Chen
9,956,744 B2    5/2018  Sun et al.
(Continued)

FOREIGN PATENT DOCUMENTS

CN          1745200 A      3/2006
CN        101033553 A      9/2007
(Continued)

OTHER PUBLICATIONS

International Search Report and Written Opinion for Application No. PCT/CN2015/098304, dated Mar. 11, 2016, 12 pages.

*Primary Examiner* — Sarang Afzali
*Assistant Examiner* — Ruth G Hidalgo-Hernandez

(57) ABSTRACT

The present disclosure provides an electronic product metal shell and a method of manufacturing the same. The electronic product metal shell includes: a metal layer; a first hard anodic oxidation layer formed on an upper surface of the metal layer; a second hard anodic oxidation layer formed on a lower surface of the metal layer; an antenna groove penetrating through the metal layer and the first hard anodic oxidation layer; and a non-conductive material filled in the antenna groove.

4 Claims, 4 Drawing Sheets

(51) Int. Cl.
*H01Q 1/24* (2006.01)
*H01Q 1/38* (2006.01)
*H01Q 13/02* (2006.01)
*H01Q 13/18* (2006.01)
*H05K 3/06* (2006.01)
*C23F 1/36* (2006.01)

(52) U.S. Cl.
CPC ............. *H01Q 13/18* (2013.01); *H05K 3/067* (2013.01); *H05K 5/04* (2013.01); *C23F 1/36* (2013.01); *H04M 1/0202* (2013.01)

(56) References Cited

U.S. PATENT DOCUMENTS

| | | | |
|---|---|---|---|
| 10,194,547 B2 * | 1/2019 | Jiang | ........................ H05K 5/04 |
| 2007/0212558 A1 | 9/2007 | Gao et al. | |
| 2007/0267299 A1 | 11/2007 | Mitani | |
| 2010/0255274 A1 | 10/2010 | Mirsky et al. | |
| 2013/0141885 A1 | 6/2013 | Gu et al. | |
| 2014/0126172 A1 | 5/2014 | Fahlgren et al. | |
| 2014/0131208 A1 | 5/2014 | Chien et al. | |
| 2014/0203975 A1 | 7/2014 | Chen | |
| 2014/0363623 A1 | 12/2014 | Sun et al. | |

FOREIGN PATENT DOCUMENTS

| | | |
|---|---|---|
| CN | 101466214 A | 6/2009 |
| CN | 102074803 A | 5/2011 |
| CN | 102736686 A | 10/2012 |
| CN | 103140089 A | 6/2013 |
| CN | 103297565 A | 9/2013 |
| CN | 203632989 U | 6/2014 |
| CN | 103945662 A | 7/2014 |
| CN | 104244648 A | 12/2014 |
| CN | 104551562 A | 4/2015 |
| EP | 2117074 A1 | 11/2009 |
| KR | 10-1399835 B1 | 5/2014 |

* cited by examiner

ELECTRONIC PRODUCT METAL SHELL HAVING ANTENNA GROOVE

CROSS-REFERENCE TO RELATED APPLICATIONS

This application is a continuation application of International Application No. PCT/CN2015/098304, filed on Dec. 22, 2015, which is based on and claims priority to and benefits of Chinese Patent Application No. 201410834560.7, filed with the State Intellectual Property Office (SIPO) of the People's Republic of China on Dec. 26, 2014. The entire contents of the above-identified applications are incorporated herein by reference.

FIELD

Examples of the present disclosure generally relate to the field of electronic product manufacturing technology, and more particularly to an electronic product metal shell having an antenna groove and a method of manufacturing the same.

BACKGROUND

Currently, in order to solve problems of signal shielding caused by shell, electronic products, such as metal cell phone, mostly adopt a method of slotting on a rear cover of the cell phone and then injection molding. For example, HTC ONE has an upper and a lower antenna slots, iPhone 5/5s has a side antenna slot, etc. However, the method of slotting an antenna slot on electronic product metal shell (for example, rear cover of the metal cell phone) and then injection molding stated above may cause some damages to the whole structure of the electronic product metal shell, and affect cleanliness and integrity of appearance of the electronic product metal shell. Meanwhile, a visible plastic of the electronic product metal shell (for example, rear cover of the metal cell phone) would also damage a metal texture of the whole electronic product metal shell.

SUMMARY

The present disclosure seeks to solve the problem that the method in prior art that slotting an antenna slot on the electronic product metal shell and then injection molding may affect cleanliness and integrity of appearance of the electronic product metal shell and damage a metal texture of the whole electronic product metal shell, and thus provide an electronic product metal shell having an antenna groove and a method of manufacturing the same. The antenna groove formed on the electronic product metal shell of the present disclosure is not visible on appearance via naked eye. The appearance of the surface of the electronic product metal shell will not be damaged, the appearance of the surface of an aluminum alloy shell is smooth and tidy, which may maintain a cleanliness and integrity of appearance of the electronic product metal shell and will not damage a metal texture of the whole electronic product metal shell.

Thus, in order to achieve objectives stated above, examples of a first aspect of the present disclosure provide an electronic product metal shell having an antenna groove. The electronic product metal shell includes: a metal layer; a first hard anodic oxidation layer formed on an upper surface of the metal layer; a second hard anodic oxidation layer formed on a lower surface of the metal layer; an antenna groove penetrating through the metal layer and the first hard anodic oxidation layer; and a non-conductive material filled in the antenna groove.

Examples of a second aspect of the present disclosure provide a method of manufacturing an electronic product metal shell having an antenna groove. The method includes steps of:

(1) applying a hard anodizing treatment and an ink spraying treatment in sequence to a metal layer, so as to form a first hard anodic oxidation layer, a second hard anodic oxidation layer, a first ink layer and a second ink layer, wherein the first hard anodic oxidation layer is formed on an upper surface of the metal layer, the second hard anodic oxidation layer is formed on a lower surface of the metal layer, the first ink layer is formed on an upper surface of the first hard anodic oxidation layer, and the second ink layer is formed on an lower surface of the second hard anodic oxidation layer;

(2) forming an antenna groove on an upper surface of a product obtained after step (1), wherein the antenna groove penetrates through the first ink layer, the first hard anodic oxidation layer and the metal layer in a thickness direction of the product; and (3) removing the first ink layer and the second ink layer and filling a non-conductive material in the antenna groove.

Examples of a third aspect of the present disclosure provide an electronic product metal shell. The electronic product metal shell is obtained via the method stated above.

The antenna groove formed on the electronic product metal shell of the present disclosure is not visible on appearance via naked eye. The appearance of the surface layer of the electronic product metal shell will not be destroyed, the appearance surface of the aluminum alloy shell is smooth and tidy, which may maintain a cleanliness and integrity of appearance of the electronic product metal shell and will not destroy a metal texture of the whole electronic product metal shell.

The present disclosure further provides an electronic product metal shell including a metal layer having an antenna groove penetrating through the metal layer, and a hard anodic oxidation layer formed on a surface of the metal layer.

These and other aspects and advantages of examples of the present disclosure will be described in detail with reference to the following detail description.

Reference number: 1 metal layer, 2 hard anodic oxidation layer, 21 first hard anodic oxidation layer, 22 second hard anodic oxidation layer, 3 ink layer, 31 first ink layer, 32 second ink layer, 4 antenna groove slit formed by deep radium carving, 5 antenna groove, 6 antenna groove slit formed by normal radium carving.

DETAILED DESCRIPTION

Reference will be made in detail to examples of the present disclosure. The examples described herein are explanatory and illustrative, which are used to generally understand the present disclosure. The examples shall not be construed to limit the present disclosure.

Figure 8:
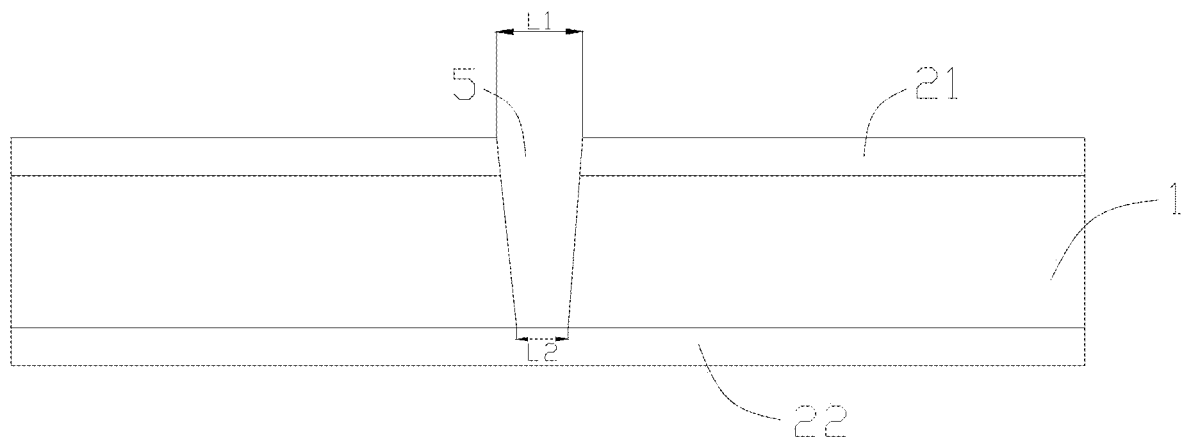
FIG. 8 is a schematic view of an electronic product metal shell according to one example of the present disclosure.

According to a first aspect of examples of the present disclosure, an electronic product metal shell having an antenna groove is provided. As shown in FIG. 8, the electronic product metal shell includes: a metal layer 1; a first hard anodic oxidation layer 21 formed on an upper surface of the metal layer; a second hard anodic oxidation layer 22 formed on a lower surface of the metal layer; an antenna groove 5 penetrating through the metal layer 1 and the first hard anodic oxidation layer 21; and a non-conductive material (not shown) filled in the antenna groove.

In other words, the electronic product metal shell according to the present disclosure includes: a metal layer 1 and a hard anodic oxidation layer (21,22) coated on surface of the metal layer 1; an antenna groove 5 penetrating through a back hard anodic oxidation layer 21 and the metal layer 1 in the thickness direction so as to expose an inner side of a front hard anodic oxidation layer 22; and a non-conductive material is filled in the antenna groove 5.

In some examples of the present disclosure, a width L1 of an upper opening of the antenna groove 5 is larger than width L2 of a lower opening of the antenna groove 5. In some examples of the present disclosure, the upper opening has a width L1 of about 3 millimeters to about 15 millimeters. In some other example of the present disclosure, the upper opening has a width L1 of about 3 millimeters to about 6 millimeters. In some examples of the present disclosure, the lower opening has a width L2 of about 1 millimeter to about 3 millimeters. In some other example of the present disclosure, the lower opening has a width L2 of about 1 millimeter to about 1.6 millimeters. In other words, according to the electronic product metal shell of examples of the present disclosure, an opening of the antenna groove 5 on a back surface of the electronic product metal shell is defined as an upper opening, the antenna groove has a sectional structure of trapezoid that the upper opening has a size larger than a lower opening, the upper opening has a width L1 of about 3 millimeters to about 15 millimeters, for example, in some examples of the present disclosure, the upper opening has a width L1 of about 3 millimeters to about 6 millimeters; and the lower opening has a width L2 of about 1 millimeter to about 3 millimeters, for example, in some examples of the present disclosure, the lower opening has a width L2 of about 1 millimeter to about 1.6 millimeters.

In some examples of the present disclosure, the metal layer 1 has a thickness of about 0.5 millimeters to about 1.5 millimeters, both the first hard anodic oxidation layer 21 and the second hard anodic oxidation layer 22 have a thickness of about 0.02 millimeters to about 0.06 millimeters. Or in other words, in the electronic product metal shell of the present disclosure, the metal layer 1 has a thickness of about 0.5 millimeters to about 1.5 millimeters, for example, in some examples of the present disclosure, the metal layer 1 has a thickness of about 0.5 millimeters to about 0.8 millimeters. The hard anodic oxidation layer (21, 22) has a thickness of about 0.02 millimeters to about 0.06 millimeters, for example, in some examples of the present disclosure, the hard anodic oxidation layer (21, 22) has a thickness of about 0.04 millimeters to about 0.06 millimeters.

In some examples of the present disclosure, the metal layer 1 includes an aluminum alloy layer.

In some examples of the present disclosure, the electronic product metal shell includes a cell phone metal shell or a tablet computer metal shell.

Figure 9:
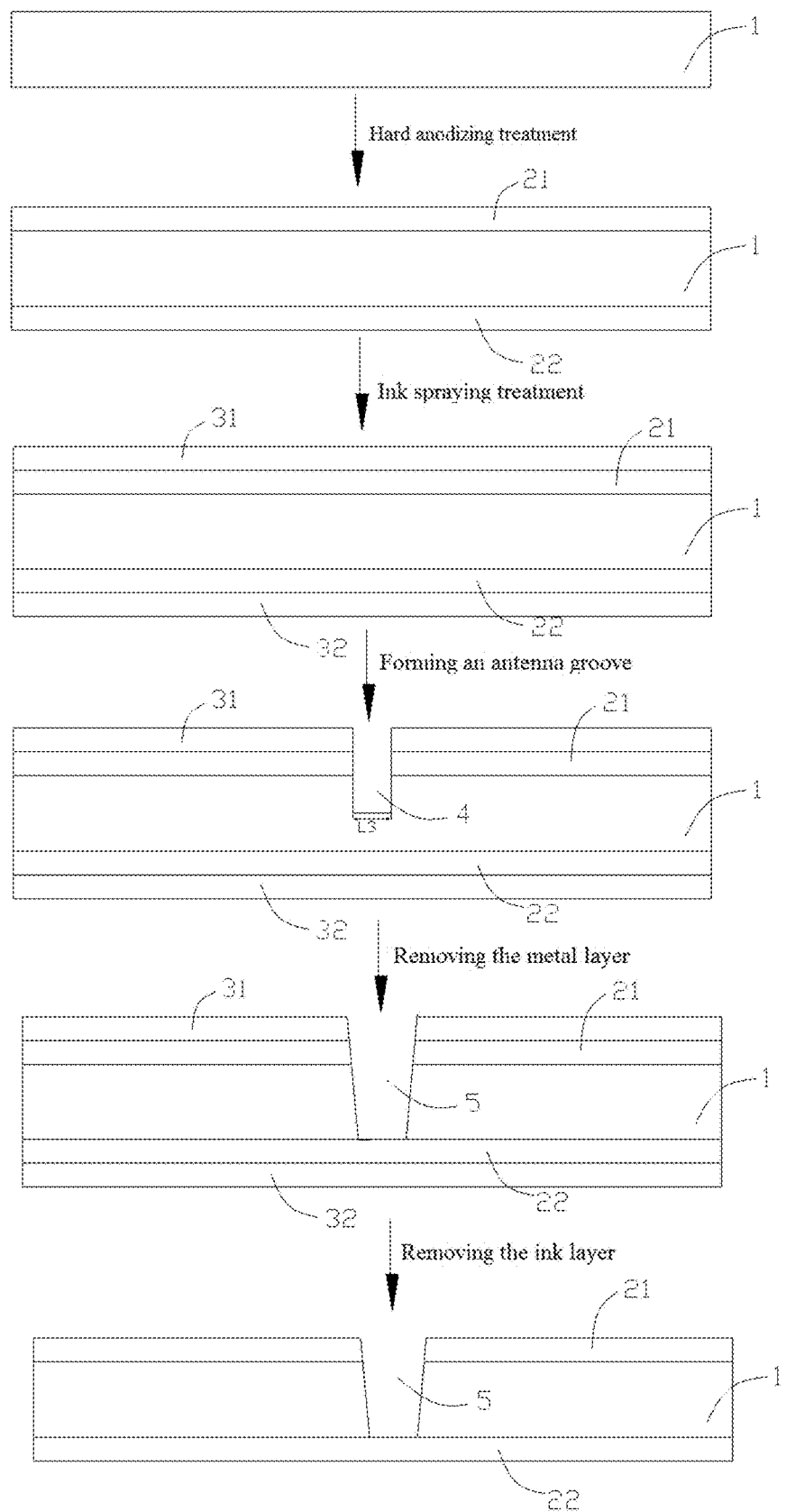
FIG. 9 is a process schematic view of a method of manufacturing an electronic product metal shell according to examples of the present disclosure.

According to a second aspect of examples of the present disclosure, a method of manufacturing an electronic product metal shell having an antenna groove is provided. As shown in FIG. 9, the method of manufacturing an electronic product metal shell having an antenna groove includes steps of:

(1) applying a hard anodizing treatment and an ink spraying treatment in sequence to a metal layer 1, so as to form a first hard anodic oxidation layer 21, a second hard anodic oxidation layer 22, a first ink layer 31 and a second ink layer 32, wherein the first hard anodic oxidation layer 21 is formed on an upper surface of the metal layer 1, the second hard anodic oxidation layer 22 is formed on a lower surface of the metal layer 1, the first ink layer 31 is formed on an upper surface of the first hard anodic oxidation layer 21, and the second ink layer 32 is formed on an lower surface of the second hard anodic oxidation layer 22;

(2) forming an antenna groove 5 on an upper surface of a product obtained after step (1), wherein the antenna groove 5 penetrates through the first ink layer 31, the first hard anodic oxidation layer 21 and the metal layer 1 in a thickness direction of the product; and (3) removing the first ink layer 31 and the second ink layer 32 and filling a non-conductive material in the antenna groove 5.

In other words, the method of manufacturing an electronic product metal shell includes steps of:

(A) applying a hard anodizing treatment and an ink spraying treatment in sequence to a metal layer, so as to form a hard anodic oxidation layer (21, 22) and an ink layer (31, 32) respectively;

(B) forming an antenna groove 5 on a back surface of a first product obtained from step (A), wherein the antenna groove 5 penetrating through a back ink layer 31, a back hard anodic oxidation layer 21 and the metal layer 1 in a thickness direction of the first product so as to expose an inner side of the front hard anodic oxidation layer 22; and (C) removing the ink layer (31, 32) and filling a non-conductive material in the antenna groove 5.

In some embodiments, in step (1) or step (A), the hard anodizing treatment includes: subjecting the metal layer to an alkaline etching treatment, a desmutting treatment, an oxidizing treatment and a sealing treatment in sequence, and washing after each one of the alkaline etching treatment, the desmutting treatment, the oxidizing treatment and the sealing treatment. In examples of the present disclosure, there is no particular limitation for the method of washing, it could be any commonly used washing method in the art, for example, washing by deionized water for 2-3 times. The method of hard anodizing treatment is not to be limited in scope by the specific preferred embodiments disclosed herein.

In some embodiments, the alkaline etching treatment is carried out under conditions of: a temperature of about 50 Celsius degrees to about 70 Celsius degrees, a time of about 1 minute to about 2 minutes, and an alkaline etching solution having a concentration of about 30 g/L to about 60 g/L and including at least one selected from a group consisting of sodium hydroxide, potassium hydroxide and lithium hydroxide. The method of alkaline etching treatment is not to be limited in scope by the specific preferred embodiments disclosed herein.

In some embodiments, the desmutting treatment is carried out under conditions of: a temperature of about 20 Celsius degrees to about 30 Celsius degrees, a time of about 1 minute to about 3 minutes, a desmutting solution including nitric acid aqueous solution. Per one liter of the desmutting solution, the nitric acid has a content of about 130 grams to about 270 grams (which is substantially equivalent to about 200 mL to about 400 mL of a concentrated nitric acid having a concentration of about 65 wt % to about 68 wt %), that is, in per liter of the desmutting solution, the nitric acid has a content of about 130 grams to about 270 grams. The method of desmutting treatment is not to be limited in scope by the specific preferred embodiments disclosed herein.

In some embodiments, the oxidizing treatment is carried out under conditions of: a temperature of about 5 Celsius degrees to about 12 Celsius degrees, a time of about 30 minutes to about 50 minutes, an impulse waveform of positive square wave pulse, a duty ratio of about 50% to about 90%, a frequency of about 500 Hz to about 1000 Hz, a current density of about 2 A/dm$^2$ to about 7 A/dm$^2$, an oxidation solution including an aqueous solution of sulfuric acid, oxalic acid/malic acid. Per 1 liter of the oxidation solution, the sulfuric acid has a content of about 120 grams to 220 grams, the oxalic acid or the malic acid has a content of about 8 grams to about 20 grams. That is, the oxidation solution includes an aqueous solution of sulfuric acid, and oxalic acid or malic acid, and in per liter of the oxidation solution, the sulfuric acid has a content of about 120 grams to 220 grams, the oxalic acid or the malic acid has a content of about 8 grams to about 20 grams. The oxidation solution including an aqueous solution of sulfuric acid, oxalic acid/ malic acid refers to a solution including sulfuric acid and oxalic acid, or a solution including sulfuric acid and malic acid. The method of oxidizing treatment is not to be limited in scope by the specific preferred embodiments disclosed herein.

In some embodiments, the conditions of sealing treatment includes: a temperature of about 20 Celsius degrees to about 30 Celsius degrees and a time of about 2 minutes to about 3 minutes. In some examples, a sealant includes at least one selected from a group consisting of nickel-free sealant, sealant with trace nickel and heavy metal-free sealant. For those skilled in the art, the hard anodizing treatment includes a washing treatment after the sealing treatment, and a hard anodic oxidation layer is obtained by blow-drying after the washing treatment, that is, the first hard anodic oxidation layer 21 and the second hard anodic oxidation layer 22 is obtained by blow-drying after the washing treatment. There is no particular limitation for the method of the blow-drying, it could be any commonly used method in the art. For example, the blow-drying may be carried out with an oil-free compressed gas at a temperature of about 20 Celsius degrees to about 30 Celsius degrees for about 5 minutes to about 10 minutes, which is well known by those skilled in the art, and therefore detailed description is omitted herein. The method of sealing treatment is not to be limited in scope by the specific preferred embodiments disclosed herein.

In some embodiments, in step (1), the ink spraying treatment further includes: spraying an UV ink on surface of the first hard anodic oxidation layer 21 and the second hard anodic oxidation layer 22 respectively, and then baking under a temperature of about 110 Celsius degrees to about 120 Celsius degrees for about 20 minutes to about 30 minutes and exposing under an ultraviolet ray for about 1 minute to about 2 minutes. The first ink layer or the second ink layer formed has a thickness of about 40 microns to about 60 microns. Or in other words, in step (A), ink spraying treatment includes: spraying an UV ink to form a ink layer (31, 32) having a thickness of about 40 microns to about 60 microns, and then baking under a temperature of about 110 Celsius degrees to about 120 Celsius degrees for about 20 minutes to about 30 minutes and exposing under an ultraviolet ray for about 1 minute to about 2 minutes. The method of ink spraying treatment is not to be limited in scope by the specific preferred embodiments disclosed herein.

In examples of the present disclosure, for those skilled in the art, the front surface (namely the lower surface) of the electronic product metal shell refers to a surface of the electronic product metal shell that exposed in the air when the electronic product metal shell is assembled in a finished electronic product, and the back surface (namely the upper surface) is a surface of the electronic product metal shell that opposite to the front surface.

In examples of the present disclosure, in step (2), forming the antenna groove further includes: (2-1) forming an antenna groove slit 4 extending from the first ink layer 31 to the metal layer 1 and at least penetrating through the first ink layer 31 and the first hard anodic oxidation layer 21; and (2-2) removing part of the metal layer 1 along an extending direction of the antenna groove slit 4 so as to form the antenna groove 5 penetrating through the metal layer 1. In other words, in step (B), forming the antenna groove includes: forming an antenna groove slit 4 on a back surface of a product obtained from step (A) so as to at least remove the back ink layer 31 and the back hard andic oxidation layer 21, and then removing the metal layer 1 corresponding to the antenna groove slit 4 until exposing the inner side of the front hard andic oxidation layer 22.

In some examples of the present disclosure, the antenna groove slit 4 penetrates through the first ink layer 31 and the first hard anodic oxidation layer 21 and enters into the metal layer 1. In some other examples of the present disclosure, a thickness of the antenna groove slit 4 entering into the metal layer 1 is no more than 40% of a total thickness of the metal layer 1, in some examples of the present disclosure, a thickness of the antenna groove slit 4 entering into the metal layer is about 20% to about 30% of the total thickness of the metal layer 1. In step (2-1), the antenna groove slit 4 is formed via radium carving.

In other words, in examples of the present disclosure, in order to reduce destruction on structure of the electronic product metal shell, guarantee that no convex mark would be formed on the second surface of the electronic product metal shell, and further improve a solidity and hardness, in step (B), antenna groove slit 4 is formed on a back surface of the product obtained from step (A) via radium carving so as to remove the back ink layer 31, the back hard andic oxidation layer 21, and part of the metal layer 1. A thickness of the part of the metal layer 1 removed is 0% to about 40%, preferably 20%-30%, of the total thickness of the metal layer 1. It should be noted that, when the thickness of the part of the metal layer 1 removed is 0% to about 10% of the total thickness of the metal layer 1, the radium carving is a normal radium carving; when the thickness of the part of the metal layer 1 removed is about 10% to about 40% of the total thickness of the metal layer 1, the radium carving is a deep radium carving (it should be noted that when the thickness of the part of the metal layer 1 removed is 10% of the total thickness of the metal layer 1, the radium carving is a normal radium carving).

In some embodiments, the radium carving may be carried out by a radium carving machine. In some examples of the present disclosure, the antenna groove slit 4 has a width of about 0.05 millimeters to about 0.1 millimeters. The method of radium carving is not to be limited in scope by the specific preferred embodiments disclosed herein.

In examples of the present disclosure, in step (2-2), the part of the metal layer is removed via etching. That is, the metal layer 1 corresponding to the antenna groove slit is removed via etching. There is no particular limitation for the conditions of the etching, it could be any commonly used conditions of etching in the art. In some examples of the present disclosure, the etching is carried out with an acid etching solution. There is no particular limitation for the acid etching solution, it could be any commonly used acid etching solution in the art. For example, in some examples of the present disclosure, the acid etching solution may include a ferric trichloride-type acid etching solution, copper chloride-type acid etching solution or hydrochloric acid-type acid etching solution. In some examples of the present disclosure, in step (2-2), the etching is carried out with etching solution including an aqueous solution having ferric trichloride and hydrochloric acid, and per 1 liter of the etching solution, the ferric trichloride has a content of about 800 grams to about 1000 grams, and the hydrochloric acid has a content of about 35 grams to about 75 grams, and the etching is carried out under a temperature of about 20 Celsius degrees to about 30 Celsius degrees for about 30 minutes to about 40 minutes. That is, in step (B), the etching is carried out under conditions of: a temperature of about 20 Celsius degrees to about 30 Celsius degrees, a time of about 30 minutes to about 40 minutes, an etching solution includes an aqueous solution having ferric trichloride and hydrochloric acid, and per 1 liter of the etching solution, the ferric trichloride has a content of about 800 grams to about 1000 grams, and the hydrochloric acid has a content of about 35 grams to about 75 grams. It should be noted that, the time of etching is related to the thickness of the part of metal layer removed via radium carving, the thicker the removed part of the metal layer is, the shorter the time of etching is, or the thinner the removed part of the metal layer is, the longer the time of etching is.

In examples of the present disclosure, the opening of the antenna groove corresponding to the back surface of the electronic product metal shell is defined as an upper opening, the antenna groove has a sectional structure of trapezoid that the upper opening has a size larger than a lower opening. When the antenna groove slit 4 is formed via deep radium carving, the upper opening of the antenna groove 5 formed after etching has a width L1 of about 3 millimeters to about 6 millimeters, and the lower opening has a width L2 of about 1 millimeter to about 1.6 millimeters; when the antenna groove slit 4 is formed via normal radium carving, the upper opening of the antenna groove 5 formed after etching has a width L1 of about 10 millimeters to about 15 millimeters, and the lower opening has a width L2 of about 2 millimeters to about 3 millimeter.

In examples of the present disclosure, the metal layer 1 may include other metal impurities, such as copper, manganese. Therefore, in some examples of the present disclosure, the method of manufacturing an electronic product metal shell may further include, in step (2-2) or step (B), washing after etching, peeling black film after washing to remove black impurity layer exposed, and washing again. There is no particular limitation for the method of washing, it could be any commonly used washing method in the art, for example, washing by deionized water for 2-3 times.

In examples of the present disclosure, there is no particular limitation for the method of removing the ink layer (31, 32), it could be any commonly used painting removing method in the art, as long as the ink layer (31, 32) could be removed. In some examples of the present disclosure, in step (3) or step (C), the ink layer (31, 32) may be removed by a neutral paint remover. There is no particular limitation for the neutral paint remover, it could be any commonly used neutral paint remover in the art, for example, the neutral paint remover could be at least one selected from a group consisting of general solvent-based paint remover, chlorinated hydrocarbon-type paint remover and aqueous paint remover.

For those skilled in the art that, in examples of the present disclosure, the method of manufacturing an electronic product metal shell may further include: washing and drying, after removing the ink layer (31, 32) and prior to filling the non-conductive material. There is no particular limitation for the method of drying, it could be any commonly used drying method in the art. For example, the drying is carried out under a condition including: a temperature of about 80 Celsius degrees to about 120 Celsius degrees, and a time of about 5 minutes to about 10 minutes.

Alternatively, there is no particular limitation for the method of filling the non-conductive material and there is no particular limitation for the non-conductive material. In some examples of the present disclosure, the non-conductive material includes at least one selected from a group consisting of UV glue, thermal curing glue, and room temperature curing adhesive.

In some examples of the present disclosure, the metal layer 1 includes an aluminum alloy layer.

In some examples of the present disclosure, the electronic product metal shell includes a cell phone metal shell or a tablet computer metal shell.

According to a third aspect of the present disclosure, an electronic product metal shell obtained from the method stated above is provided. The electronic product metal shell has the same characteristics and advantages as the electronic product metal shell stated above, detailed description is omitted herein.

EXAMPLES

Examples described hereafter will give further description to the present disclosure, which shall not be construed to limit the present disclosure.

In the examples below, the aluminum material of series 5 having a thickness of 0.5 millimeters is purchased from FUJIAN NANPING ALUMINUM CO., LTD.

The nickel-free sealant, sealant with trace nickel and heavy metal-free sealant are purchased from SHENZHEN ODM TECHNOLOGY CO., LTD.

The chlorinated hydrocarbon paint remover is purchased from DONGGUAN SIHUI SURFACE PROCESSING TECHNOLOGY CO., LTD.

The UV glue is purchased form Japanese ASEC company, the UV glue is AS-210604C.

The radium carving machine is purchased from SHENZHEN GDLASER TECHNOLOGY CO., LTD, The radium carving machine is FM20D.

Example 1

This Example is used to illustrate an aluminum alloy shell having an antenna groove of a cell phone and a method of manufacturing the same according to the present disclosure.
(1) Alkaline etching treatment: A series 5 aluminum alloy layer 1 having a thickness of 0.5 millimeters is cut to form an aluminum alloy plate having a size of 5 centimeters*3.5 centimeters. Then the aluminum alloy plate is subjected to an alkaline etching treatment in a sodium hydroxide solution having a concentration of 40 g/L under 60 Celsius degrees for 1.5 minutes, and then the aluminum alloy plate is washed twice by deionized water.
(2) Desmutting treatment: The aluminum alloy plate obtained from step (1) is subjected to a desmutting treatment in a desmutting solution (per 1 liter of the desmutting solution, a volume of concentrated nitric acid having a concentration of 65 wt % is 300 mL) under 25 Celsius degrees for 2 minutes, and then the aluminum alloy plate is washed twice by deionized water.
(3) Oxidizing treatment: The aluminum alloy plate obtained from step (2) is placed in an oxidation tank so as to conduct an hard oxidizing treatment. The hard oxidizing treatment is carried out under 10 Celsius degrees with a positive square wave pulse, a duty ratio of 50%, a frequency of 800 Hz, and a current density of 5 A/dm$^2$ for 40 minutes (per 1 liter of an oxidation solution, a content of a 98 wt % sulfuric acid is 200 grams, a content of a oxalic acid is 15 grams, and remaining is water), and then the aluminum alloy plate is washed twice by deionized water.
(4) Sealing treatment: The aluminum alloy plate obtained from step (3) is sealed with a nickel-free sealant under 25 Celsius degrees for 2.5 minutes, and then the aluminum alloy plate is washed twice by deionized water, and then the aluminum alloy plate is blow-dried via an oil-free compressed gas under 25 Celsius so as to obtain a hard anodic oxidation layer 2 having a thickness of 35 microns.
(5) Ink spraying treatment: A UV ink is sprayed on the surface of the aluminum alloy plate obtained from step (4) to form an ink layer 2 having a thickness of 50 microns, and then the aluminum alloy plate is baked under 115 Celsius degrees for 25 minutes and exposed under ultraviolet ray for 1.5 minutes.
(6) An antenna groove slit 4 having a width of 0.07 millimeters is radium carved on a back surface of the aluminum alloy plate obtained from step (5) via a radium carving machine so as to remove the ink layer, the hard anodic oxidation layer and part of the aluminum alloy layer having a thickness of 25% of the total thickness of the aluminum alloy layer on back surface of the aluminum alloy plate.
(7) The aluminum alloy plate is etched in an etching solution (per 1 L etching solution, a content of ferric trichloride hexahydrate is 900 grams, a content of 37 wt % hydrochloric acid is 150 mL, and remaining is water) under 25 Celsius degree for 35 minutes so as to remove a part of aluminum alloy layer corresponding to the antenna groove slit. By observing, an inner side of the hard anodic oxidation layer coated on a front surface of the aluminum alloy plate is entirely exposed. Then the aluminum alloy plate is washed twice by deionized water, and an exposed black impurity layer is peeled away, and then then the aluminum alloy plate is washed twice by deionized water again. Then an antenna groove 5 having a sectional structure of trapezoid that the upper opening has a size larger than that of a lower opening of the antenna groove is obtained, the upper opening has a width of 4.5 millimeters, and the lower opening has a width of 1.25 millimeters.
(8) The ink layer is removed via a chlorinated hydrocarbon solvent paint remover, and then the aluminum alloy plate is washed twice by deionized water and baked under 100 Celsius degrees for 7 minutes.
(9) A UV glue is filled within the antenna groove.

Figure 1:
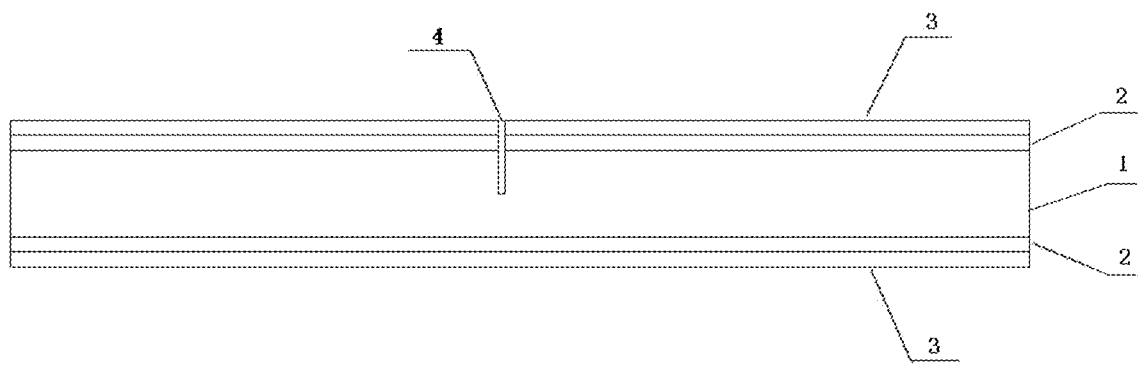
FIG. 1 is a sectional structure schematic view of the aluminum alloy shell after radium carving (deep radium carving) of Example 1 of the present disclosure.
Figure 2:
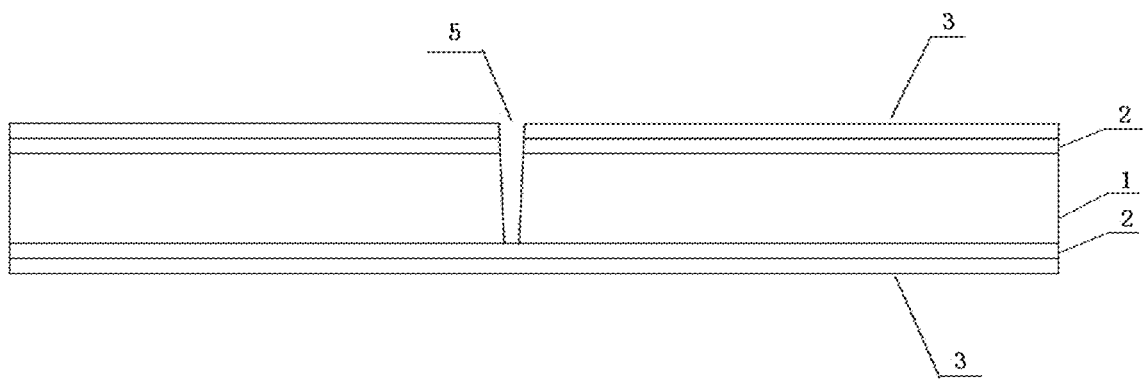
FIG. 2 is a sectional structure schematic view of the aluminum alloy shell after etching of Example 1 of the present disclosure.
Figure 3:
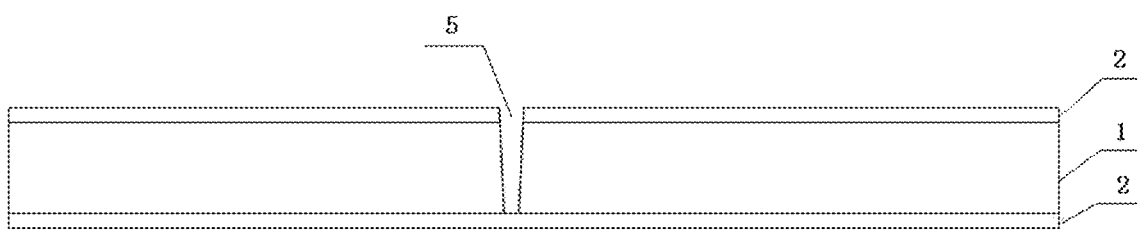
FIG. 3 is a sectional structure schematic view of the aluminum alloy shell after removing the ink layer of Example 1 of the present disclosure.
Figure 4:
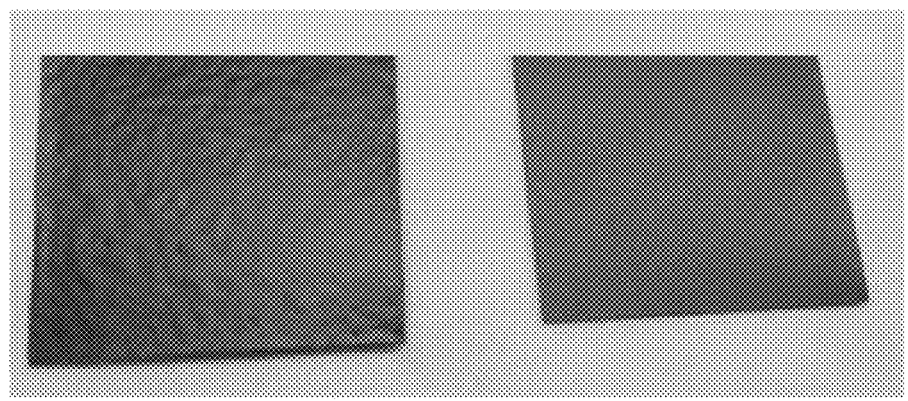
FIG. 4 is a picture of the aluminum alloy shell after hard anodizing treatment (left) and after ink spraying treatment (right) of Example 1 of the present disclosure.
Figure 5:
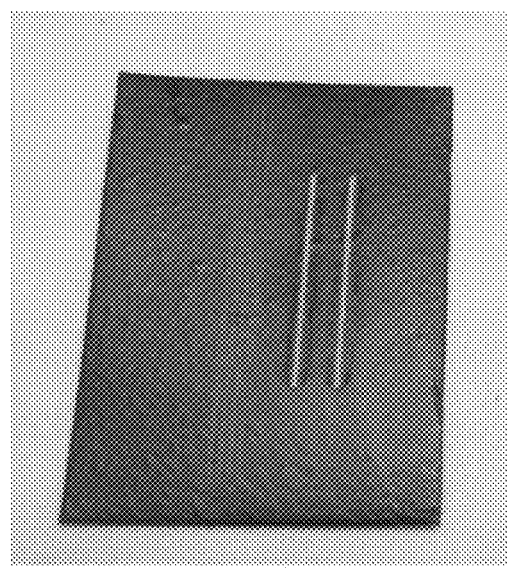
FIG. 5 is a picture of the aluminum alloy shell after radium carving of Example 1 of the present disclosure.
Figure 6:
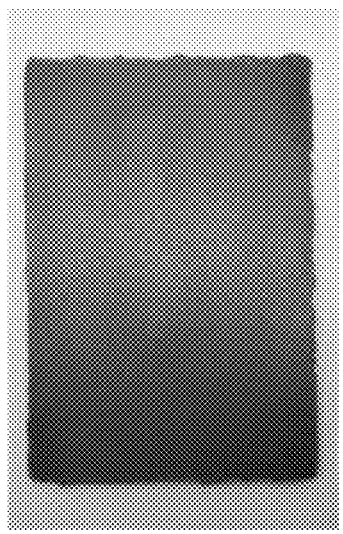
FIG. 6 is a picture of the aluminum alloy shell after filling the non-conductive material of Example 1 of the present disclosure.
Figure 7:
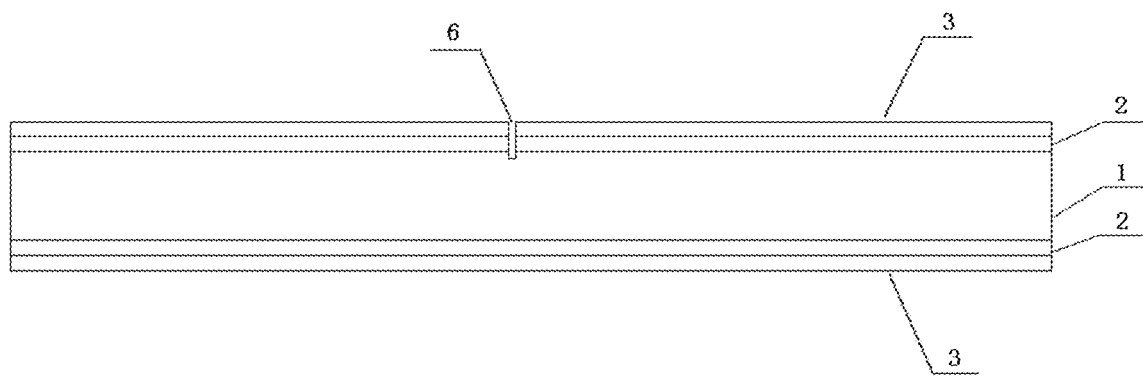
FIG. 7 is a picture of the aluminum alloy shell after radium carving (normal radium carving) of Example 1 of the present disclosure.

In this Example, a sectional structure schematic view of the aluminum alloy shell after radium carving is shown in FIG. 1, a sectional structure schematic view of the aluminum alloy shell after etching is shown in FIG. 2, a sectional structure schematic view of the aluminum alloy shell after removing the ink layer is shown in FIG. 3, a picture of the aluminum alloy shell after hard anodizing treatment (left) and after ink spraying treatment (right) is shown in FIG. 4, a picture of the aluminum alloy shell after radium carving is shown in FIG. 5, and a picture of the aluminum alloy shell after filling the non-conductive material is shown in FIG. 6.

The antenna groove formed on the aluminum alloy shell according to this Example is not visible on appearance via naked eye. The appearance of the surface layer of the aluminum alloy shell will not be destroyed, the appearance surface of the aluminum alloy shell is smooth and tidy, which may maintain a cleanliness and integrity of appearance of the phone body and will not damage a metal texture of the whole phone body.

Example 2

This Example is used to illustrate an aluminum alloy shell having an antenna groove of a cell phone and a method of manufacturing the same of the present disclosure.
(1) Alkaline etching treatment: A series 5 aluminum alloy layer 1 having a thickness of 0.5 millimeters is cut to form an aluminum alloy plate having a size of 5 centimeters*3.5 centimeters. Then the aluminum alloy plate is subjected to an alkaline etching treatment in a potassium hydroxide solution having a concentration of 30 g/L under 50 Celsius degrees for 2 minutes, and then the aluminum alloy plate is washed twice by deionized water.
(2) Desmutting treatment: The aluminum alloy plate obtained from step (1) is subjected to a desmutting treatment in a desmutting solution (per 1 liter of the desmutting solution, a volume of concentrated nitric acid having a concentration of 65 wt % is 400 mL) under 20 Celsius degrees for 2 minutes, and then the aluminum alloy plate is washed twice by deionized water.
(3) Oxidizing treatment: The aluminum alloy plate obtained from step (2) is placed in an oxidation tank so as to conduct a hard oxidizing treatment. The hard oxidizing treatment is carried out under 5 Celsius degrees with a positive square wave pulse, a duty ratio of 50%, a frequency of 500 Hz, and a current density of 2 A/dm$^2$ for 50 minutes (per 1 liter of an oxidation solution, a content of a 98 wt % sulfuric acid is 220 grams, a content of an oxalic acid is 20 grams, and remaining is water), and then the aluminum alloy plate is washed twice by deionized water.
(4) Sealing treatment: The aluminum alloy plate obtained from step (3) is sealed with a nickel-free sealant under 20

Celsius degrees for 3 minutes, and then the aluminum alloy plate is washed twice by deionized water, and then the aluminum alloy plate is blow-dried via an oil-free compressed gas under 25 Celsius so as to obtain a hard anodic oxidation layer 2 having a thickness of 40 microns.

(5) Ink spraying treatment: A UV ink is sprayed on the surface of the aluminum alloy plate obtained from step (4) to form an ink layer 2 having a thickness of 40 microns, and then the aluminum alloy plate is baked under 110 Celsius degrees for 30 minutes and exposed under ultraviolet ray for 1 minute.

(6) An antenna groove slit 4 having a width of 0.05 millimeters is radium carved on a back surface of the aluminum alloy plate obtained from step (5) via a radium carving machine so as to remove the ink layer, the hard anodic oxidation layer and part of the aluminum alloy layer having a thickness of 20% of the total thickness of the aluminum alloy layer on back surface of the aluminum alloy plate.

(7) The aluminum alloy plate is etched in an etching solution (per 1 L etching solution, a content of ferric trichloride hexahydrate is 1000 grams, a content of 37 wt % hydrochloric acid is 200 mL, and remaining is water) under 20 Celsius degree for 30 minutes so as to remove a part of aluminum alloy layer corresponding to the antenna groove slit. By observing, an inner side of the hard anodic oxidation layer coated on a front surface of the aluminum alloy plate is entirely exposed. Then the aluminum alloy plate is washed twice by deionized water, and an exposed black impurity layer is peeled away, and then then the aluminum alloy plate is washed twice by deionized water again. Then an antenna groove 5 having a sectional structure of trapezoid that the upper opening has a size larger than that of a lower opening of the antenna groove is obtained, the upper opening has a width of 5 millimeters, and the lower opening has a width of 1.3 millimeters.

(8) The ink layer is removed via a chlorinated hydrocarbon solvent paint remover, and then the aluminum alloy plate is washed twice by deionized water and baked under 80 Celsius degrees for 10 minutes.

(9) A UV glue is filled within the antenna groove.

In this Example, the sectional structure schematic view of the aluminum alloy shell after radium carving, the sectional structure schematic view of the aluminum alloy shell after etching, the sectional structure schematic view of the aluminum alloy shell after removing the ink layer, the picture of the aluminum alloy shell after hard anodizing treatment (left) and after ink spraying treatment (right), the picture of the aluminum alloy shell after radium carving, and the picture of the aluminum alloy shell after filling the non-conductive material are the same as shown in Example 1.

The antenna groove formed on the aluminum alloy shell according to this Example is not visible on appearance via naked eye. The appearance of the surface layer of the aluminum alloy shell will not be destroyed, the appearance surface of the aluminum alloy shell is smooth and tidy, which may maintain a cleanliness and integrity of appearance of the phone body and will not damage a metal texture of the whole phone body.

Example 3

This Example is used to illustrate an aluminum alloy shell having an antenna groove of a tablet computer and a method of manufacturing the same of the present disclosure.

(1) Alkaline etching treatment: A series 5 aluminum alloy layer 1 having a thickness of 0.5 millimeters is cut to form an aluminum alloy plate having a size of 5 centimeters*3.5 centimeters. Then the aluminum alloy plate is subjected to an alkaline etching treatment in a potassium hydroxide solution having a concentration of 60 g/L under 70 Celsius degrees for 1 minute, and then the aluminum alloy plate is washed twice by deionized water.

(2) Desmutting treatment: The aluminum alloy plate obtained from step (1) is subjected to a desmutting treatment in a desmutting solution (per 1 liter of the desmutting solution, a volume of concentrated nitric acid having a concentration of 65 wt % is 200 mL) under 30 Celsius degrees for 3 minutes, and then the aluminum alloy plate is washed twice by deionized water.

(3) Oxidizing treatment: The aluminum alloy plate obtained from step (2) is placed in an oxidation tank so as to conduct a hard oxidizing treatment. The hard oxidizing treatment is carried out under 12 Celsius degrees with a positive square wave pulse, a duty ratio of 90%, a frequency of 1000 Hz, and a current density of 7 A/dm$^2$ for 30 minutes (per 1 liter of an oxidation solution, a content of a 98 wt % sulfuric acid is 120 grams, a content of an oxalic acid is 8 grams, and remaining is water), and then the aluminum alloy plate is washed twice by deionized water.

(4) Sealing treatment: The aluminum alloy plate obtained from step (3) is sealed with a heavy metal-free sealant under 30 Celsius degrees for 2 minutes, and then the aluminum alloy plate is washed twice by deionized water, and then the aluminum alloy plate is blow-dried via an oil-free compressed gas under 25 Celsius so as to obtain a hard anodic oxidation layer 2 having a thickness of 50 microns.

(5) Ink spraying treatment: A UV ink is sprayed on the surface of the aluminum alloy plate obtained from step (4) to form an ink layer 2 having a thickness of 60 microns, and then the aluminum alloy plate is baked under 120 Celsius degrees for 20 minutes and exposed under ultraviolet ray for 2 minutes.

(6) An antenna groove slit 4 having a width of 0.1 millimeters is radium carved on a back surface of the aluminum alloy plate obtained from step (5) via a radium carving machine so as to remove the ink layer, the hard anodic oxidation layer and part of the aluminum alloy layer having a thickness of 30% of the total thickness of the aluminum alloy layer on back surface of the aluminum alloy plate.

(7) The aluminum alloy plate is etched in an etching solution (per 1 L etching solution, a content of ferric trichloride hexahydrate is 800 grams, a content of 37 wt % hydrochloric acid is 100 mL, and remaining is water) under 30 Celsius degree for 40 minutes so as to remove a part of aluminum alloy layer corresponding to the antenna groove slit. By observing, an inner side of the hard anodic oxidation layer coated on a front surface of the aluminum alloy plate is entirely exposed. Then the aluminum alloy plate is washed twice by deionized water, and an exposed black impurity layer is peeled away, and then then the aluminum alloy plate is washed twice by deionized water again. Then an antenna groove 5 having a sectional structure of trapezoid that the upper opening has a size larger than that of a lower opening of the antenna groove is obtained, the upper opening has a width of 4 millimeters, and the lower opening has a width of 1.2 millimeters.

(8) The ink layer is removed via a chlorinated hydrocarbon solvent paint remover, and then the aluminum alloy plate is washed twice by deionized water and baked under 120 Celsius degrees for 5 minutes.

(9) A UV glue is filled within the antenna groove.

In this Example, the sectional structure schematic view of the aluminum alloy shell after radium carving, the sectional structure schematic view of the aluminum alloy shell after etching, the sectional structure schematic view of the aluminum alloy shell after removing the ink layer, the picture of the aluminum alloy shell after hard anodizing treatment (left) and after ink spraying treatment (right), the picture of the aluminum alloy shell after radium carving, and the picture of the aluminum alloy shell after filling the non-conductive material are the same as shown in Example 1.

The antenna groove formed on the aluminum alloy shell according to this Example is not visible on appearance via naked eye. The appearance of the surface layer of the aluminum alloy shell will not be destroyed, the appearance surface of the aluminum alloy shell is smooth and tidy, which may maintain a cleanliness and integrity of appearance of the tablet computere body and will not damage a metal texture of the whole tablet computer body.

Example 4

The method in the Example is similar to that in Example 1 with exceptions that: in step (6), the ink layer, the hard anodic oxidation layer and part of the aluminum alloy layer having a thickness of 15% of the total thickness of the aluminum alloy layer on back surface of the aluminum alloy plate is removed.

In this Example, the sectional structure schematic view of the aluminum alloy shell after radium carving, the sectional structure schematic view of the aluminum alloy shell after etching, the sectional structure schematic view of the aluminum alloy shell after removing the ink layer, the picture of the aluminum alloy shell after hard anodizing treatment (left) and after ink spraying treatment (right), the picture of the aluminum alloy shell after radium carving, and the picture of the aluminum alloy shell after filling the non-conductive material are the same as shown in Example 1. The upper opening of the antenna groove has a width of 6 millimeters, and the lower opening of the antenna groove has a width of 1.5 millimeter.

The antenna groove formed on the aluminum alloy shell according to this Example is not visible on appearance via naked eye. The appearance of the surface layer of the aluminum alloy shell will not be destroyed, the appearance surface of the aluminum alloy shell is smooth and tidy, which may maintain a cleanliness and integrity of appearance of the phone body and will not damage a metal texture of the whole phone body.

Example 5

The method in the Example is similar to that in Example 1 with exceptions that: in step (6), the ink layer, the hard anodic oxidation layer and part of the aluminum alloy layer having a thickness of 5% of the total thickness of the aluminum alloy layer on back surface of the aluminum alloy plate is removed.

In this Example, the sectional structure schematic view of the aluminum alloy shell after radium carving, the sectional structure schematic view of the aluminum alloy shell after etching, the sectional structure schematic view of the aluminum alloy shell after removing the ink layer, the picture of the aluminum alloy shell after hard anodizing treatment (left) and after ink spraying treatment (right), the picture of the aluminum alloy shell after radium carving, and the picture of the aluminum alloy shell after filling the non-conductive material are the same as shown in Example 1. The radium carving is performed on a back surface of the aluminum alloy plate obtained from step (5) so as to remove the ink layer, the hard anodic oxidation layer and part of the aluminum alloy layer having a thickness of 5% of the total thickness of the aluminum alloy layer on back surface of the aluminum alloy plate to form a normal radium carved antenna groove slit 4. The upper opening of the antenna groove has a width of 12 millimeters, and the lower opening of the antenna groove has a width of 2.5 millimeter.

The antenna groove formed on the aluminum alloy shell according to this Example is not visible on appearance via naked eye. The appearance of the surface layer of the aluminum alloy shell will not be destroyed, the appearance surface of the aluminum alloy shell is smooth and tidy, which may maintain a cleanliness and integrity of appearance of the phone body and will not damage a metal texture of the whole phone body.

It should be known by those skilled in the art that the smaller the widths of the upper opening of the antenna groove and the lower opening of the antenna groove are, the better firmness and hardness the aluminum alloy shell have. By comparing the Example 1 with the Examples 4 and 5, after removing part of the aluminum alloy layer, when the thickness of the residual aluminum alloy layer is about 20% to about 30% of the total thickness of the aluminum alloy layer, the widths of the upper opening and the lower opening of the antenna groove formed after etching could be evidently reduced, which can effectively improve the firmness and hardness of the aluminum alloy shell.

Test Example

The aluminum alloy shells obtained from Examples 1-5 are subjected to a signal shielding test, the test method is: Two conducting positions are radium curved on two parts of the aluminum alloy shell separated by the un-visible antenna groove respectively, and then an electrical conductivity between the two conducting positions are tested. All of the test results of Examples 1-5 show that it is non-conducting between the two conducting positions. Therefore, not only the cleanliness and integrity of appearance of the electronic product metal shell is maintained and a metal texture of the electronic product metal shell body will not be damaged, but also a signal shielding problem of the electronic product metal shell body could be well solved.

Although explanatory examples stated above have been shown and described in detail, it may be appreciated by those skilled in the art that the above examples cannot be construed to limit the present disclosure, various simple modifications could be made within technical spirit and principles of the present disclosure, those simple modifications all fall into the protection scope of the present disclosure.

In addition, it should be noted that, each specific technical feature described in the example stated above, under no contradiction, could be combined via any appropriate manner, in order to avoid unnecessary repetition, various possible combination manners are not illustrated in the present disclosure.

In addition, each different example of the present disclosure could also be combined with each other without departing from spirit and principles of the present disclosure, which should also be deemed as content of present disclosure.

What is claimed is:

1. An electronic product metal shell, comprising:
a metal layer;
a first hard anodic oxidation layer formed on an upper surface of the metal layer;
a second hard anodic oxidation layer formed on a lower surface of the metal layer;
an antenna groove penetrating through the metal layer and the first hard anodic oxidation layer to reach a surface of the second hard anodic oxidation layer; and
a non-conductive material filled in the antenna groove.

2. The electronic product metal shell of claim 1, wherein a width of an upper opening of the antenna groove is larger than a width of a lower opening of the antenna groove.

3. The electronic product metal shell of claim 1, wherein the metal layer includes an aluminum alloy layer.

4. An electronic product metal shell, comprising:
a metal layer having an antenna groove penetrating through the metal layer and a first hard anodic oxidation layer formed on an upper surface of the metal layer, wherein the antenna groove is filled with a non-conductive material; and
a second hard anodic oxidation layer formed on a lower surface of the metal layer, wherein the antenna groove reaches a surface of the second hard anodic oxidation layer.

* * * * *